(12) United States Patent
Thibedeau et al.

(10) Patent No.: US 6,242,921 B1
(45) Date of Patent: Jun. 5, 2001

(54) ALTERNATOR TESTING APPARATUS AND METHOD

(75) Inventors: Dennis G. Thibedeau, Franklin, WI (US); Craig Govekar, Gurnee, IL (US)

(73) Assignee: Snap-on Tools Company, Kenosha, WI (US)

( * ) Notice: Subject to any disclaimer, the term of this patent is extended or adjusted under 35 U.S.C. 154(b) by 0 days.

(21) Appl. No.: 09/183,367

(22) Filed: Oct. 30, 1998

(51) Int. Cl.[7] .................................................. G01N 27/46
(52) U.S. Cl. ............................ 324/429; 324/426; 320/135
(58) Field of Search ................................... 324/426, 428, 324/429, 433, 444, 772; 320/135, 136, DIG. 10

(56) References Cited

U.S. PATENT DOCUMENTS

| | | |
|---|---|---|
| 3,984,762 | * 10/1976 | Dowgiallo ............................ 324/430 |
| 4,423,379 | * 12/1983 | Jacobs et al. ........................ 324/429 |
| 4,459,548 | 7/1984 | Lentz et al. . |
| 4,884,033 | 11/1989 | McConchie, Sr. . |
| 4,937,514 | 6/1990 | Iwatani . |
| 4,937,528 | * 6/1990 | Palanisamy ........................... 324/430 |
| 4,949,046 | * 8/1990 | Seyfang ................................ 324/427 |
| 5,023,539 | 6/1991 | Miller et al. . |
| 5,057,814 | 10/1991 | Onan et al. . |
| 5,140,253 | 8/1992 | Itoh . |
| 5,144,232 | 9/1992 | Veenstra . |
| 5,254,951 | * 10/1993 | Goto et al. ............................ 324/426 |
| 5,254,952 | 10/1993 | Salley et al. . |
| 5,281,919 | 1/1994 | Palanisamy . |
| 5,319,305 | 6/1994 | Baba . |
| 5,336,993 | 8/1994 | Thomas et al. . |
| 5,448,152 | * 9/1995 | Albright ................................. 320/15 |
| 5,512,831 | * 4/1996 | Cixar et al. .......................... 324/426 |
| 5,550,485 | 8/1996 | Falk . |
| 5,583,440 | 12/1996 | Bisher . |
| 5,592,094 | 1/1997 | Ichikawa . |
| 5,701,089 | 12/1997 | Perkins . |
| 5,721,688 | 2/1998 | Bramwell . |
| 5,751,217 | * 5/1998 | Kchao et al. ........................ 340/636 |
| 5,811,976 | * 9/1998 | Fischer ................................ 324/434 |

* cited by examiner

Primary Examiner—Safet Metjahic
Assistant Examiner—Vincent Q. Nguyen
(74) Attorney, Agent, or Firm—Seyfarth Shaw

(57) ABSTRACT

An alternator test apparatus includes a processor and solenoid drivers for controlling solenoids to selectively switch three discrete, fixed-resistance loads and combinations thereof in parallel across the battery terminals, while monitoring battery output voltage and alternator output current. The system automatically sequentially increases the load from zero to a maximum load and stores the maximum alternator output current and the load at which it was achieved. After application of the maximum load, the system returns to the load at which maximum alternator output was achieved and tests the alternator diode.

18 Claims, 2 Drawing Sheets

ALTERNATOR TESTING APPARATUS AND METHOD

BACKGROUND OF THE INVENTION

The present invention relates to methods and apparatus for testing the battery charging systems of vehicles, such as automotive vehicles and, in particular, to systems for testing alternators while connected to the battery in the vehicle.

A number of devices have been used for testing the quality and quantity of an alternator's output. These devices typically involve loading the battery, while monitoring the alternator output. For this purpose, prior devices have use variable-load carbon piles, single fixed loads and the vehicle's own electrical accessories to increase the load on the charging system. However, each of these prior techniques has disadvantages. Carbon pile loads tend to degrade over time. Single fixed load systems cannot reliably determine the true maximum output of the alternator, because the results obtained from the single fixed load tester will vary greatly depending on the state of the charge of the battery and the size of the alternator under test. The vehicle's own electrical accessories do not create a sufficient load for effective alternator testing.

SUMMARY OF THE INVENTION

It is a general object of the invention to provide an improved alternator testing system, which avoids the disadvantages of prior systems while affording additional structural and operating advantages.

An important feature of the invention is the provision of an alternator testing apparatus which is repeatable, consistent and does not degrade over time.

Another feature of the invention is the provision of an apparatus of the type set forth, which is of simple and economical construction.

Still another feature of the invention is the provision of an apparatus of the type set forth, for testing both the current output and the diode status of an alternator.

Yet another feature of the invention is the provision of a repeatable and consistent method for accurately testing a vehicle alternator.

Certain ones of these and other features of the invention may be attained by providing apparatus for testing a battery charging device while connected to the battery terminals, comprising: a plurality of discrete fixed-resistance loads, a plurality of switching devices respectively connected to the loads for connecting each load across the battery terminals, a controller coupled to the switching devices for automatically operating them in a predetermined sequence for varying the load on the battery, and monitoring circuitry coupled to the controller and to the charging device for monitoring the output of the charging device during loading of the battery.

Other features of the invention may be attained by providing an apparatus of the type set forth controlled by a processor operating under stored program control, for sequentially increasing the load on the alternator and storing the value of the load at which maximum output current from the alternator is achieved.

Still other features may be attained by providing a method for testing a battery charging device while connected to the battery terminals, comprising: connecting discrete fixed-resistance loads and combinations thereof across the battery terminals in a predetermined sequence, and monitoring the output current of the charging device during loading of the battery.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENT

Figure 1:
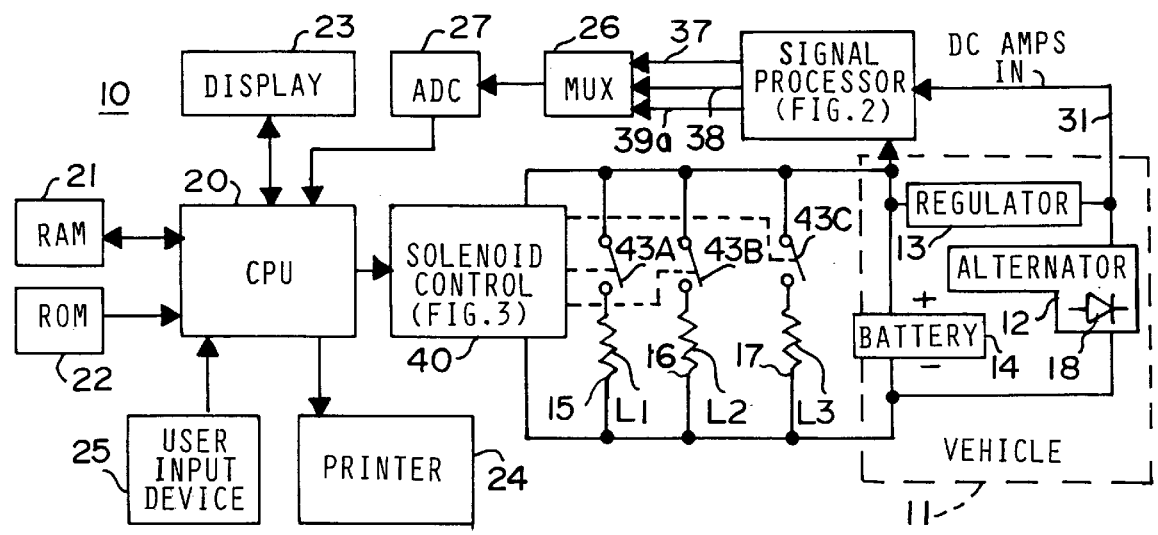
FIG. 1 is a partially schematic and partially functional block diagrammatic view of the alternator tester of the present invention.

Referring to FIG. 1, there is illustrated an alternator testing system, generally designated by the numeral 10, constructed in accordance with the present invention, for testing the charging system of a vehicle 11. The tester is particularly designed for testing an alternator 12, which is typically coupled through a voltage regulator 13 or other voltage controlling device to the terminals of the automotive battery 14, all in a well-known manner. The system 10 is specifically designed for testing the alternator 12 while it is in the vehicle 11 and connected to the battery 14 and, while the engine of the vehicle 11 is running. It is a fundamental aspect of the invention that the system 10 automatically sequentially connects one or more of three discrete fixed-resistance loads 15, 16 and 17 across the terminals of the battery 14. Preferably, each of the loads 15–17 is in the nature of a length of nichrome strip, but it will be appreciated that other types of resistive loads could be utilized. Preferably, each of the loads 15–17 has a different resistance value, the values preferably being selected so that, respectively, they will, when connected across the battery while the engine is running, draw different output currents from the alternator 12. For example, the loads may be nominally rated 50, 75 and 100 amps. The system 10 can also be operated to test the condition of the diode 18 of the alternator 12.

The system 10 has a controller which includes a central processing unit ("CPU") 20 and a solenoid control 40. The CPU 20 may be a microprocessor, and is coupled to associated RAM and ROM storage devices 21 and 22. Preferably, a suitable display 23 is also connected to the CPU 20, and may take the form of an LCD display or a CRT display, also other types of displays could also be utilized. Also connected to the CPU 20 are a printer 24 and a user input device 25, which may comprise one or more variable switches, such as thumb wheels or the like, or may alternatively be in the nature of a keypad or keyboard. The system 10 includes a multiplexer 26 which receives input signals from the alternator 12 and the battery 14, which signals are then alternately passed to an analog-to-digital converter ("ADC") 27, the digital output of which is applied to the CPU 20.

Figure 2:
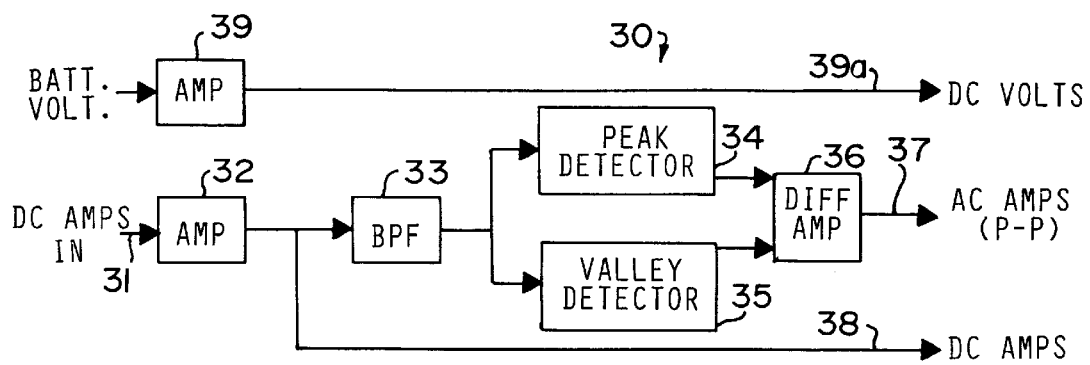
FIG. 2 is a functional block diagrammatic view of the signal processor portion of the tester of FIG. 1.

Preferably, battery output voltage monitoring leads and the alternator output current monitoring leads are coupled to the multiplexer 26 through a signal processor 30, details of which are illustrated in FIG. 2. A DC Amps In signal from the alternator output is received on a line 31 and applied through an amplifier 32, the output of which is filtered in a bandpass filter 33 to remove frequencies below 100 Hz. and above 4 KHz. The output of the filter 33 is applied to a peak detector 34 and to a valley detector 35, the outputs of which are applied to a differential amplifier 36 which, effectively, adds the outputs of the detectors 34 and 35, since they are of opposite polarity. The output of the amplifier 36 is applied on a line 37 to the multiplexer 26 as an AC Amps signal, which represents the peak-to-peak value of the alternator output current, including the ripple current. The output of the amplifier 32 is also applied directly to the multiplexer 26 on line 38 as a DC Amps signal. The battery output voltage is applied to an amplifier 39, the output of which is applied on line 39a to the multiplexer 26 as the DC Volts signal. After these current and voltage signals are digitized in the ADC 27 they are applied to the CPU 20, which utilizes them to monitor the alternator output current and the battery output voltage and to perform tests on the alternator diode, in a manner which will be explained more fully below.

Figure 3:
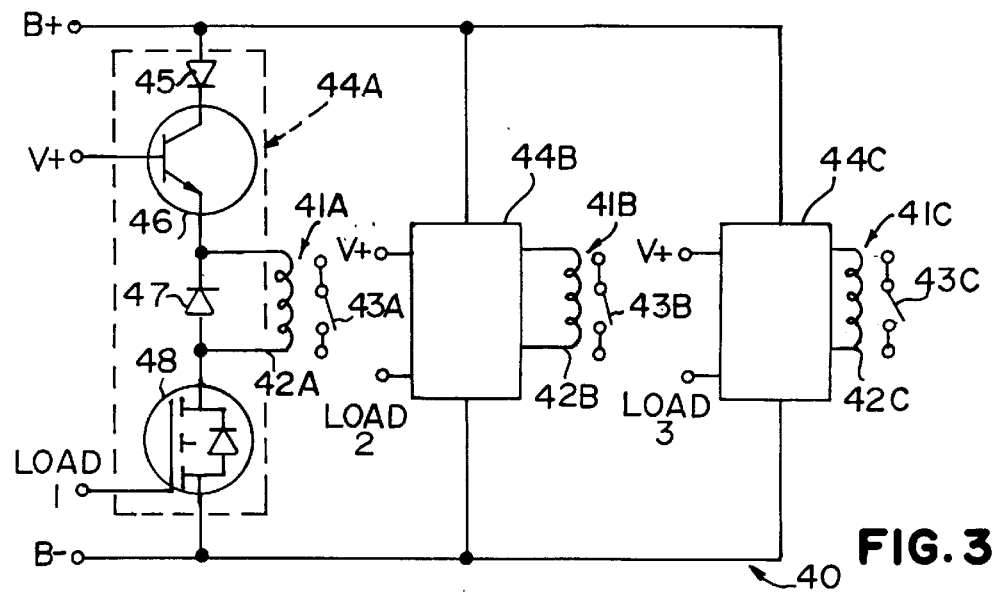
FIG. 3 is a schematic circuit diagram of the solenoid control portion of the tester of FIG. 1.

Referring also to FIG. 3, the loads 15–17 are connected across the battery 14 by means of solenoids 41A, 41B and 41C, respectively, which are operated by a solenoid control circuit 40 under the control of the CPU 20. The solenoids 41A–C respectively have solenoid coils 42A–C and normally-open contacts 43A–C, these contacts being respectively connected in series with the loads 15–17, these series combinations all being connected in parallel across the battery terminals, as illustrated in FIG. 1. The solenoids 41A–C are, respectively, operated by solenoid drivers 44A–C which are of identical construction, wherefore only the driver 44A will be described in detail.

Referring to FIG. 3 the solenoid drivers 44A–C are connected across the battery terminals. Each driver includes a diode 45, the anode of which is connected to the anode of the battery 14, and the cathode of which is connected to the collector of a transistor 46, the base of which is biased into conduction with a V+ supply voltage and the emitter of which is connected to one terminal of the solenoid coil 42. A diode 47 is connected across the coil 42A, with its cathode connected to the emitter of the transistor 46, the anode of the diode 47 being connected to the source of an FET 48, the drain of which is connected to the cathode of the battery 14 and the gate of which is connected to the CPU 20 for receiving a Load 1 control signal. The drivers 44B and 44C, respectively receive Load 2 and Load 3 control signals from the CPU 20.

In operation, the transistor 46 is biased to provide essentially a short circuit and the FET 48 becomes conductive and provides a short circuit in the presence of a Load 1 signal from the CPU 20, thereby energizing the coil 42A of the solenoid 41A and closing its contact 43A to connect the load 15 across the battery 14. The other drivers 44B and 44C operate in the same manner. Since there are three different discrete loads, respectively designated L1, L2 and L3, it will be appreciated that seven different loads can be connected across the battery, respectively corresponding to L1, L2, L3, L1+L2, L1+L3, L2+L3 and L1+L2+L3, wherein "+" indicates that both loads are simultaneously connected in parallel across the battery. The values of the loads 15–16 have been selected, in the illustrated embodiment, so that these seven different load conditions will, respectively, be nominally approximately 50 amps, 75 amps, 100 amps, 125 amps, 150 amps, 175 amps and 225 amps. The actual alternator current will, of course, depend on the system voltage. In operation, the loads are sequentially automatically connected in this order to sequentially increase the load on the battery 12 from zero to a maximum load.

Figure 4:
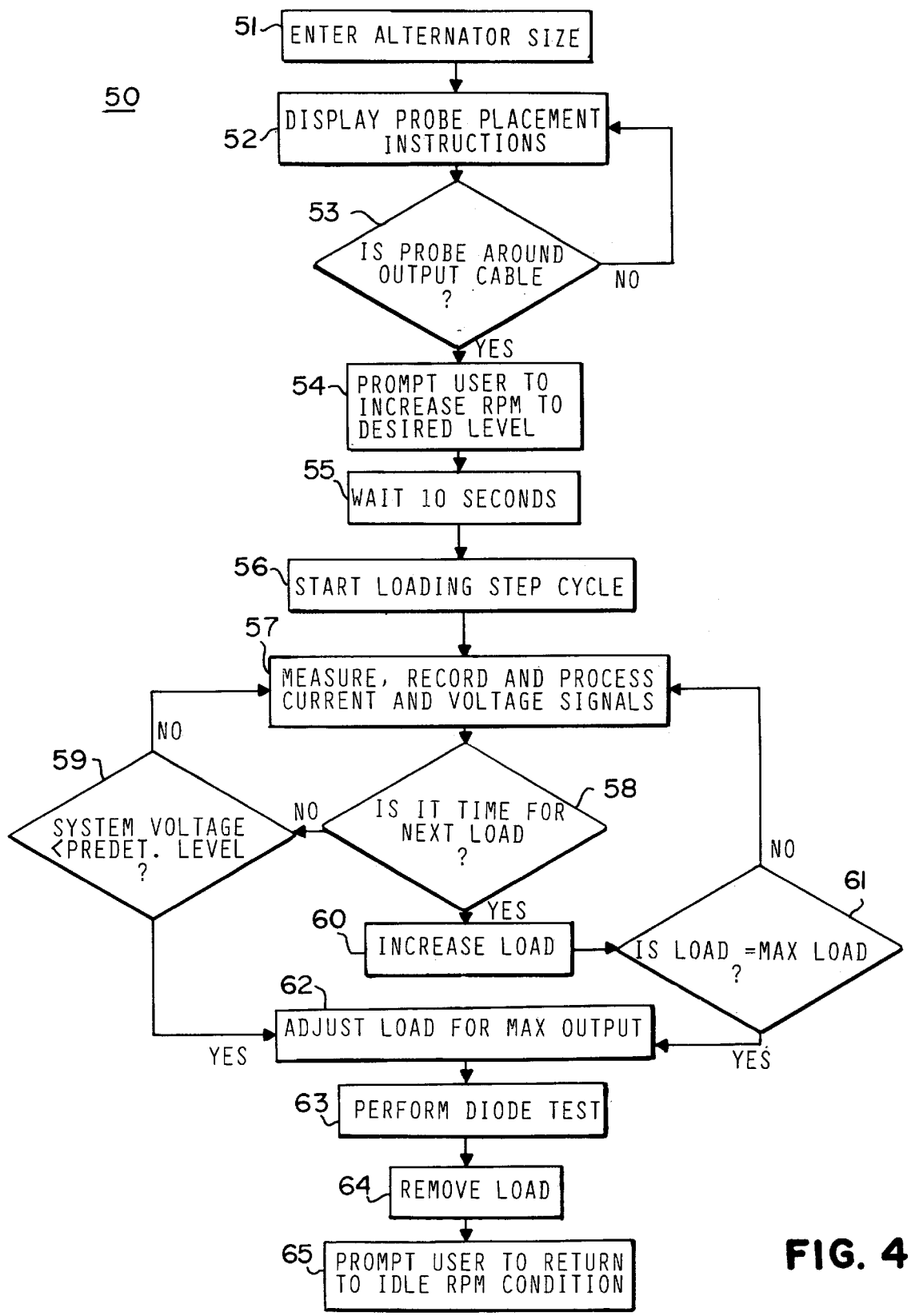
FIG. 4 is a flow chart diagram of the software control program for the tester of FIG. 1.

Referring to FIG. 4, there is illustrated a flow chart of a software program 50 for controlling the operation of the system 10. Initially, at 51, the operator enters the size of the alternator under test, in rated output current. The system will then, at 52, display probe placement instructions, directing the operator to connect the system to the alternator 18 and the battery 14. Preferably, the alternator probe is in the nature of Hall-effect sensor which is coupled around the alternator output cable. The system then checks at 53 to see if the probe is properly connected. If not, it returns to 52 and, if so, prompts the user at 54 to increase the RPM of the vehicle engine to a desired level, typically about 2,000 RPM for most vehicles. The system waits 10 seconds at 55 and then, at 56, initiates the sequential loading of the battery 14, by connecting the first load 15 (the 50-Amp load) across the battery 14, by energizing the solenoid 41A. Each different load condition will be applied for a predetermined short period of time, e.g., approximately 3–10 seconds, before connection of the next load condition. After connection of the first load, at 57, the system measures, records and processes the values of the current and voltage signals received from the ADC 27 and then checks at 58 to see if it is time to connect the next load condition. If not, it checks at 59 to see if the battery output voltage has dropped below a predetermined value, e.g., about 12 volts, if not, it returns to 57 and continues taking measurements. When, at 58, it is time for application of the next load condition, the system increases the load at 60 to the next step. In this case, the next step is the 75-Amp load, which is effected by disconnecting the load 15 by deenergizing the solenoid 41A and connecting the 75-Amp load 16 by energizing the solenoid 41B. The system then checks at 61 to see if the maximum load has been applied. If not, it returns to 57.

The system continues in this matter, increasing the load in increments by connecting and disconnecting loads 15–17 in the aforementioned predetermined sequence, until the maximum load condition (when all of loads 15–17 are connected) has been applied. At this point the system moves to 62 to adjust the load to that load at which the maximum alternator output current was experienced and then, at 63, tests the alternator diode 18. The diode test is preferably conducted in accordance with a technique disclosed in U.S. Pat. No. 4,459,548, by taking the ratio of the AC Amps signal on line 37 to the DC Amps signal on line 38 to obtain an indication of the ripple amplitude of the alternator output current. After this test is performed, the load is removed at 64 by deenergizing all of the solenoids 41A–C and the system then prompts the user at 65 to return the engine to the idle RPM condition.

In most alternator charging systems, when the battery voltage drops below about 12 volts, the alternator field current may be limited, which can prevent the alternator from achieving its maximum output. Accordingly, if, at 59, the system voltage drops below the predetermined level, it moves immediately to 62 to adjust the load for maximum alternator output so that the diode test can be performed.

Preferably, the system will display to the operator the results of the test, indicating the condition of the alternator and its diode 18. In this regard, the maximum current output reading from the alternator 12 should be within a predetermined percentage of the rated alternator output. If it is, an indication is given that the alternator condition is good. If it is outside this range, an appropriate indication is given. If the ripple amplitude of the alternator output current is sufficiently low as a percentage of the overall amplitude, the diode condition is indicated as good, otherwise it is indicated as marginal or bad, depending on its value.

From the foregoing it can be seen that there has been provided an improved alternator test system which is of simple and economical construction and which is repeatable, consistent and accurate, while avoiding degradation of the load in use.

While a particular embodiment of the present invention has been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. Apparatus for dynamically testing a battery charging device while connected to the battery terminals and charging the battery, comprising:

a plurality of discrete fixed-resistance loads, a plurality of switching devices respectively connected to the loads for connecting each load across the battery terminals, a controller coupled to the switching devices for automatically operating them in a predetermined sequence for varying the load on the battery while the battery is being charged, and monitoring circuitry coupled to the controller and adapted to be coupled to the charging device for monitoring the output of the charging device during charging and loading of the battery.

2. The apparatus of claim 1, wherein the plurality of loads includes three loads.

3. The apparatus of claim 1, wherein the loads respectively have different resistance values.

4. The apparatus of claim 1, wherein each of the loads includes a length of nichrome strip.

5. The apparatus of claim 1, wherein the controller includes means for establishing a predetermined sequence so as to sequentially increase the load on the battery from zero to a maximum load.

6. The apparatus of claim 5, wherein the controller includes a processor operating under stored program control, and a storage device coupled to the processor for storing the value of the maximum current output of the charging device and the value of the load on the battery when the maximum current output is achieved, the processor being responsive to application of the maximum load to the battery for returning to the load at which maximum charging device current output was achieved.

7. The apparatus of claim 1, and further comprising a display device coupled to the controller for indicating the condition of the charging device.

8. The apparatus of claim 1, wherein the switching devices include solenoids.

9. The apparatus of claim 8, wherein the controller includes electronic switching circuits for controlling the operation of the solenoids.

10. The apparatus of claim 1, wherein the monitoring circuitry is coupled to the battery for monitoring the system voltage.

11. The apparatus of claim 1, wherein the loads are arranged for connection in parallel across the battery terminals.

12. Apparatus for testing a battery charging device while connected to the battery terminals, comprising:

a plurality of discrete fixed-resistance loads, a plurality of switching devices respectively connected to the loads for connecting each load across the battery terminals, monitoring circuitry adapted to be coupled to the charging device and to the battery for monitoring the output current of the charging device and the system voltage, a processor operating under stored program control and coupled to the switching devices and to the monitoring circuitry for automatically operating the switching devices in a predetermined sequence for sequentially increasing the load on the battery, and a storage device coupled to the processor for storing the value of the maximum current output of the charging device and the value of the load on the battery when the maximum current output is achieved.

13. The apparatus of claim 12, wherein the plurality of loads includes three loads, respectively having different resistance values.

14. The apparatus of claim 12, wherein the charging device is an automotive vehicle alternator including a diode, the control program for the processor including a routine responsive to application of the maximum load to the battery for switching the load to that at which maximum current output of the charging device was achieved and then conducting a test of the diode.

15. The apparatus of claim 12, wherein the control program for the processor includes a routine for switching the load to that at which maximum current output of the charging device was achieved, in response to either the battery output voltage dropping below a predetermined level or application of the maximum load to the battery.

16. A method for dynamically testing a battery charging device while connected to the battery terminals and charging the battery, comprising:

connecting the charging device to the battery for charging thereof, connecting discrete fixed-resistance loads and combinations thereof across the battery terminals in a predetermined sequence while the battery is being charged, wherein the loads include three discrete loads, respectively having different resistance values, each step of the predetermined sequence including connecting one or more of the loads in parallel across the battery so as to sequentially increase the load, and monitoring the output current of the charging device during charging and loading of the battery.

17. The method of claim 16, wherein the charging device is an alternator having a diode, the method including testing the diode when the load connected to the battery is that which produces the maximum current output from the charging device.

18. The method of claim 17, and further comprising indicating to the user the condition of the charging device and the diode.

* * * * *